US010015025B2

(12) United States Patent
Ahn et al.

(10) Patent No.: US 10,015,025 B2
(45) Date of Patent: Jul. 3, 2018

(54) SEMICONDUCTOR DEVICE PERFORMING DE-SKEW OPERATION

(71) Applicants: SK hynix Inc., Icheon (KR); Industry-University Cooperation Foundation Hanyang University, Seoul (KR)

(72) Inventors: Keun-Seon Ahn, Seongnam (KR); Changsik Yoo, Seoul (KR)

(73) Assignees: SK HYNIX INC., Icheon (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 282 days.

(21) Appl. No.: 14/882,949

(22) Filed: Oct. 14, 2015

(65) Prior Publication Data

US 2016/0301518 A1 Oct. 13, 2016

(30) Foreign Application Priority Data

Apr. 10, 2015 (KR) .......................... 10-2015-0050640

(51) Int. Cl.
*H04L 25/14* (2006.01)
*H04L 7/00* (2006.01)
(Continued)

(52) U.S. Cl.
CPC ................ *H04L 25/14* (2013.01); *G11C 7/10* (2013.01); *G11C 7/1063* (2013.01);
(Continued)

(58) Field of Classification Search
CPC ....... G11C 7/10; G11C 7/1063; G11C 7/1066; G11C 7/1087; H04L 7/0008; H04L 7/0041; G06F 1/10; G06F 1/12
(Continued)

(56) References Cited

U.S. PATENT DOCUMENTS 6,944,692 B2 *  9/2005  Smith ..................... G06F 11/24
                                                    710/106
7,346,794 B1 *  3/2008  Davidson .................. G06F 1/10
                                                    713/400
(Continued)

OTHER PUBLICATIONS

Zheng et al., "A 5-Gb/s Automatic Sub-Bit Between-Pair Skew Compensator for Parallel Data Communications in 0.13-μm CMOS", 2010 Symposium on VLSI Circuits/Technical Digest of Technical Papers, 2010, pp. 71-72, IEEE.
(Continued)

*Primary Examiner* — Ji H Bae

(57) ABSTRACT

A semiconductor device includes a first data transmitting/receiving circuit, a second data transmitting/receiving circuit, and a plurality of channels configured to couple the first and second data transmitting/receiving circuits. The first data transmitting/receiving circuit includes a Tx delay unit configured to transmit data to the plurality of channels, an Rx delay unit configured to receive data from the plurality of channels, and a de-skew control unit configured to control delay amounts of the Tx delay unit and the Rx delay unit according to phase information of reference clock signals received through the plurality of channels.

14 Claims, 11 Drawing Sheets

(51) Int. Cl.
*G11C 7/10* (2006.01)
*G06F 1/10* (2006.01)
*G06F 1/12* (2006.01)

(52) U.S. Cl.
CPC .......... *G11C 7/1066* (2013.01); *G11C 7/1087* (2013.01); *G06F 1/10* (2013.01); *G06F 1/12* (2013.01); *H04L 7/0008* (2013.01); *H04L 7/0041* (2013.01)

(58) Field of Classification Search
USPC ................................................ 713/401, 503
See application file for complete search history.

(56) References Cited

U.S. PATENT DOCUMENTS

| | | | | |
|---|---|---|---|---|
| 7,486,752 | B1* | 2/2009 | Kwasniewski | H04F 7/033 375/354 |
| 7,590,008 | B1* | 9/2009 | Roge | G11C 5/04 365/189.011 |
| 8,045,663 | B2 | 10/2011 | Bae et al. | |
| 8,760,901 | B2* | 6/2014 | Riho | G11C 11/4076 365/189.07 |
| 9,620,183 | B2* | 4/2017 | Jeddeloh | G11C 5/02 |
| 2003/0126489 | A1* | 7/2003 | Johansen | G06F 1/12 713/401 |
| 2011/0185218 | A1* | 7/2011 | Nygren | G11C 7/1078 713/503 |
| 2013/0100998 | A1 | 4/2013 | Bae et al. | |
| 2013/0111256 | A1* | 5/2013 | Kim | G06F 13/1689 713/501 |
| 2014/0195728 | A1* | 7/2014 | Hsu | G06F 12/0246 711/105 |
| 2014/0241465 | A1* | 8/2014 | Itoigawa | H04L 25/0272 375/316 |

OTHER PUBLICATIONS

Lin et al., "A 1Tbit/s Bandwidth 1024 b PLL/DLL-Less eDRAM PHY Using 0.3 V 0.105 mW/Gbps Low-Swing IO for CoWoS Application", IEEE Journal of Solid-State Circuits, Apr. 2014, vol. 49, No. 4, pp. 1-12, IEEE.

* cited by examiner

SEMICONDUCTOR DEVICE PERFORMING DE-SKEW OPERATION

CROSS-REFERENCE TO RELATED APPLICATIONS

The present application claims priority of Korean Patent Application No. 10-2015-0050640, filed on Apr. 10, 2015, which is incorporated herein by reference in its entirety.

BACKGROUND

1. Field

Illustrative embodiments of the present disclosure relate to a semiconductor device performing a de-skew operation, and more particularly, to a semiconductor device including two circuits which transmit and receive data to and from each other and of which any one eliminates all skews during transmitting (Tx) and receiving (Rx) operations.

2. Description of the Related Art

FIGS. 1 to 3 are block diagrams respectively illustrating semiconductor devices 1, 2, and 3, each of which is configured to adjust a skew. A skew may arise between signals transmitted through different channels because of differences in signal propagation times of the different channels or variations in the properties of devices used to transmit and receive the signals.

In FIGS. 1 to 3, a data transmitting circuit indicates a data transmitting/receiving circuit operating in a transmission (Tx) mode, and a data receiving circuit indicates a data transmitting/receiving circuit operating in a reception (Rx) mode.

In the semiconductor device 1 of FIG. 1, the data transmitting circuit 10 transmits signals through channels 30 in synchronization with a global Tx clock signal GTCLK, and the data receiving circuit 20 receives the signals transmitted through the channels 30.

The data transmitting circuit 10 includes a Tx flip-flop 12 and a Tx buffer 13. The Tx flip-flop 12 latches data generated by a Tx core 11 in synchronization with the global Tx clock signal GTCLK.

The data receiving circuit 20 includes an Rx buffer 23 and a clock recovery circuit 24. The Rx buffer 23 receives a signal transmitted through any one line 31 of the channels 30, and the clock recovery circuit 24 generates a global Rx clock signal GRCLK from the signal outputted from the Rx buffer 23.

The data receiving circuit 20 includes a clock phase adjusting circuit 25 which generates a plurality of Rx clock signals by adjusting a phase of the global Rx clock signal GRCLK.

The data receiving circuit 20 includes an Rx flip-flop 22 and an Rx core 21. The Rx flip-flop 22 latches data in synchronization with an Rx clock signal outputted from the clock phase adjusting circuit 25, and the Rx core 21 receives the latched data from the Rx flip-flop 22.

In the semiconductor device 1 of FIG. 1, the clock phase adjusting circuit 25 within the data receiving circuit 20 provides the Rx clock signal with the adjusted phase to each channel, thereby eliminating a skew of the received data.

In the semiconductor device 2 of FIG. 2, the data receiving circuit 20A includes an Rx buffer 23 and a clock recovery circuit 24A. The Rx buffer 23 receives data from a reference channel 31 which is one of a plurality of channels, and the clock recovery circuit 24A generates a global Rx clock signal GRCLK from the data outputted from the Rx buffer 23.

The data receiving circuit 20A of FIG. 2 further includes a delay circuit 26 which adjusts a delay amount of data received through a corresponding channel of the other channels excluding the reference channel 31, based on a skew of the corresponding channel relative to the reference channel.

In the data receiving circuit 20A of FIG. 2, an Rx flip-flop 22A latches the data received through the reference channel 31 or the data outputted from the delay circuit 26 in synchronization with the global Rx clock signal GRCLK, and provides the latched data to the Rx core 21.

In the semiconductor devices 1 and 2 of FIGS. 1 and 2, the data receiving circuits 20 and 20A eliminates a skew of data. In FIG. 1, the data receiving circuit 20 eliminates a skew of data by adjusting the phase of the clock signal inputted to the Rx flip-flop 22. In FIG. 2, the data receiving circuit 20A eliminates a skew of data by adjusting the delay amount of data inputted to the Rx flip-flop 22A.

FIG. 3 illustrates the semiconductor device 3 in which a data transmitting circuit 10B eliminates a skew of data.

The data transmitting circuit 10B includes a clock phase adjusting circuit 15 which generates a plurality of Tx clock signals by adjusting a phase of a global Tx clock signal GTCLK according to phase information provided through a feedback channel 32 and a phase Rx buffer 14 from a data receiving circuit 20B.

A Tx flip-flop 12B latches data in synchronization with a corresponding Tx clock signal of the plurality of Tx clock signals.

The data receiving circuit 20B includes a phase comparison circuit 27 and a phase transmitting buffer 28. The phase comparison circuit 27 compares a phase of a global Rx clock signal GRCLK to phases of received data and outputs the phase information, and the phase transmitting buffer 28 receives the phase information and provides the received phase information to the feedback channel 32.

When the semiconductor devices 1 to 3 each includes a plurality of data receiving circuits, in the embodiments illustrated in FIGS. 1 and 2, each of the data receiving circuits includes the clock phase adjusting circuit 25 or the delay circuit 26 for the purpose of eliminating a skew of data in the data receiving circuit, thereby increasing the entire size of the semiconductor device. In the embodiment illustrated in FIG. 3, the phase comparison circuit 27 and the phase transmitting buffer 28 are added to each of the data receiving circuits 20B, and the feedback channel 32 is included in channels 30B.

FIG. 4 illustrates an example of a semiconductor device 4 which includes one data transmitting circuit 10 and a plurality of data receiving circuits 20. In FIG. 4, the semiconductor device 4 is a memory semiconductor device having a stacked structure in which one logic die 10C and a plurality of cell dies 20C are coupled through a plurality of through-electrodes 31C.

When the technologies of FIGS. 1 to 3 are applied to the semiconductor device 4, the same de-skew related circuits are included in each of the cell dies 20C. The area of the cell dies 20C used for cells is reduced as a result.

Furthermore, when the technologies of FIGS. 1 to 3 are applied to data transmitting/receiving circuits which perform two-way communication, a circuit for eliminating a data skew must be included in both of the data transmitting/receiving circuits. Thus, the area of the circuits may be further increased.

SUMMARY

Various embodiments are directed to a semiconductor device including two circuits which transmit and receive data to and from each other and of which any one eliminates all skews during Tx and Rx operations.

In an embodiment, a semiconductor device may include: a first data transmitting/receiving circuit; a second data transmitting/receiving circuit; and a plurality of channels configured to couple the first and second data transmitting/receiving circuits. The first data transmitting/receiving circuit may include: a Tx delay unit configured to transmit data to the plurality of channels; an Rx delay unit configured to receive data from the plurality of channels; and a de-skew control unit configured to control delay amounts of the Tx delay unit and the Rx delay unit according to phase information of reference clock signals received through the plurality of channels.

In an embodiment, a semiconductor device may include: a logic die; a plurality of cell dies vertically stacked over the logic die; and a plurality of through-electrodes configured to couple the logic die and the plurality of cell dies. The logic die may include: a TX delay unit configured to transmit data to a data through-electrode among the plurality of through-electrodes; a write data strobe (WDQS) Tx delay unit configured to transmit a WDQS signal to a WDQS through-electrode among the plurality of through-electrodes; an Rx delay unit configured to receive data from the data through-electrode; a read data strobe (RDQS) Rx delay unit configured to receive an RDQS signal from an RDQS through-electrode among the plurality of through-electrodes; and a de-skew control unit configured to control delay amounts of the Tx delay unit, the Rx delay unit, the WDQS Tx delay unit, and the RDQS Rx delay unit according to the phase information of reference clock signals received through the plurality of through-electrodes.

DETAILED DESCRIPTION

Figure 1:
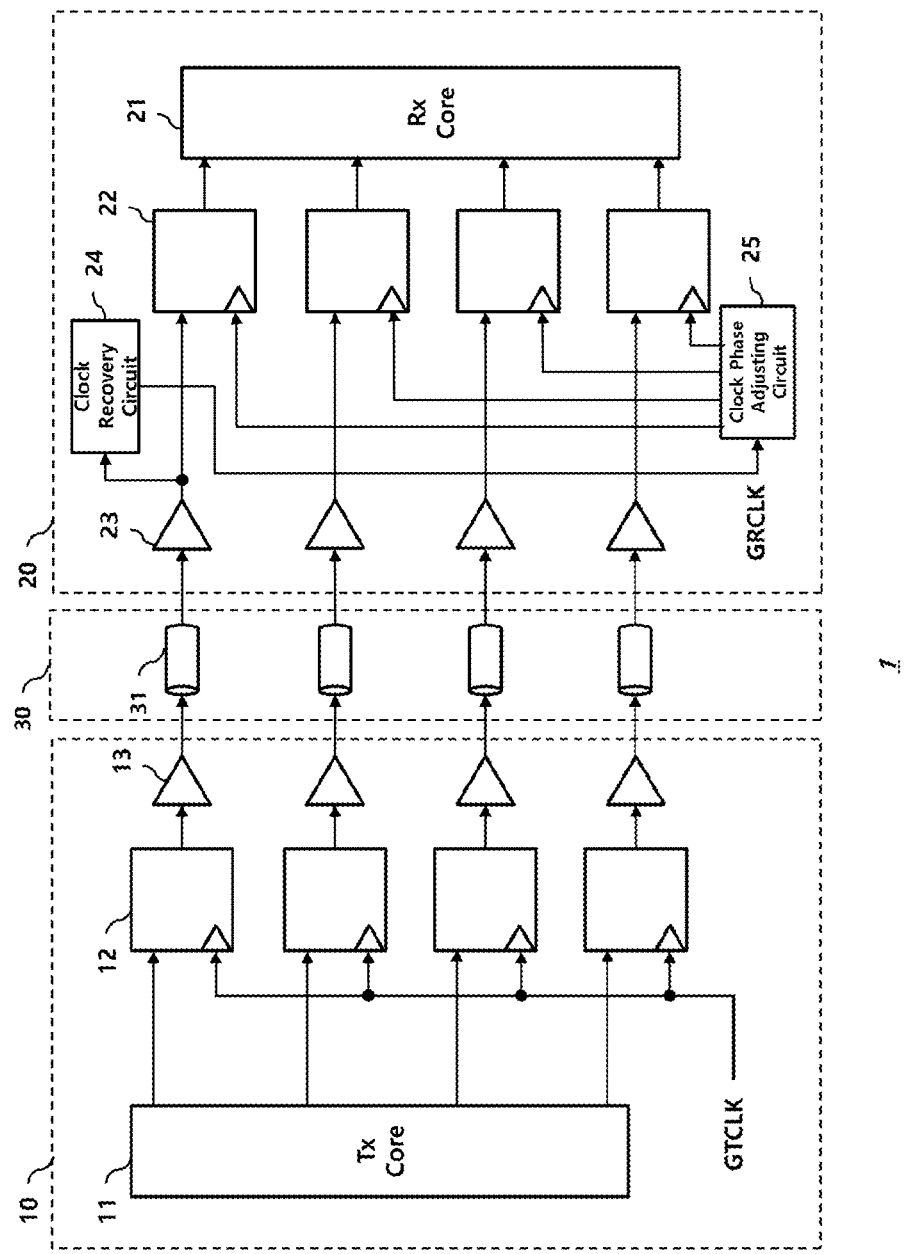
FIGS. 1 to 3 are block diagrams of semiconductor devices.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
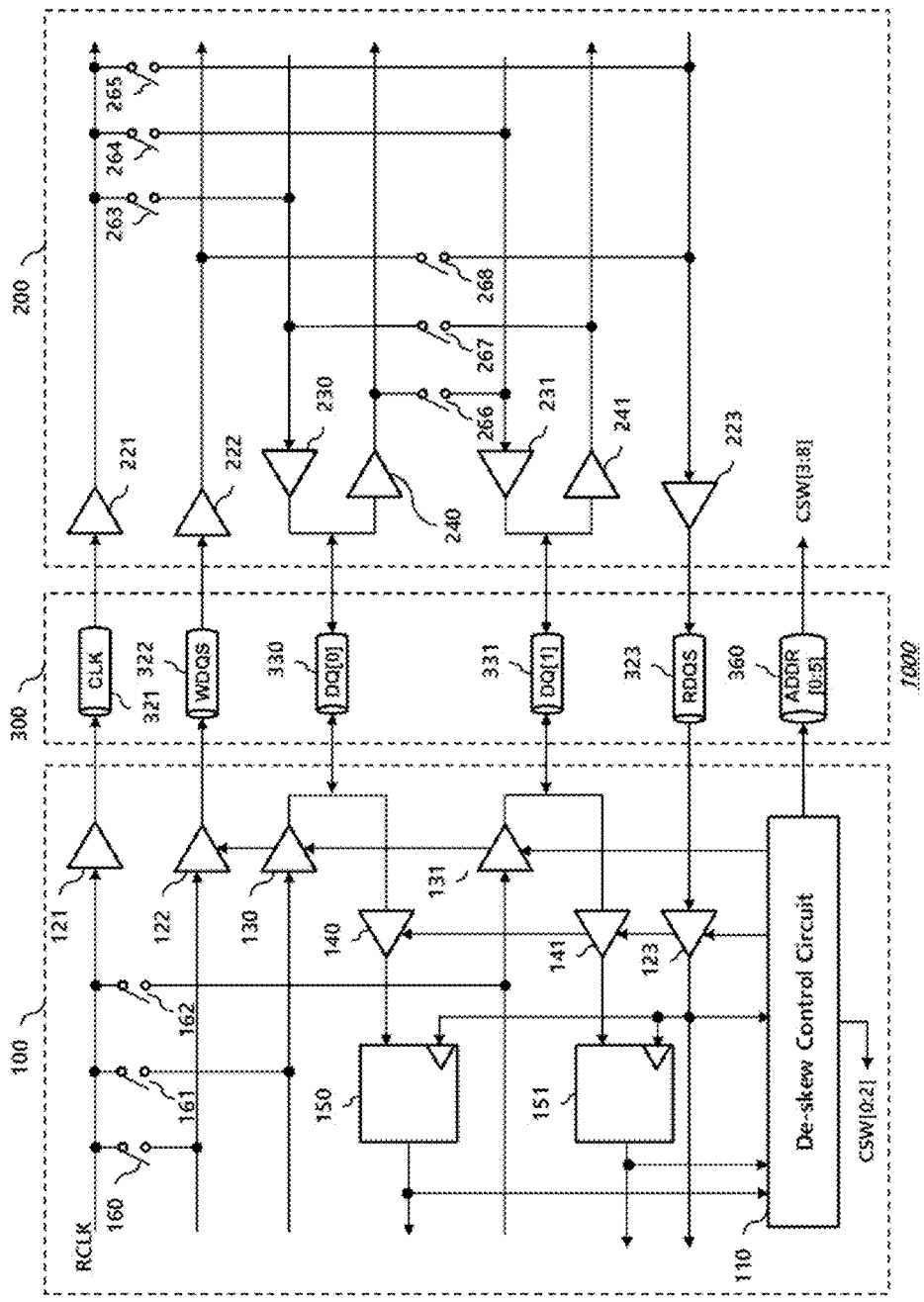
FIG. 5 is a block diagram of a semiconductor device including data transmitting/receiving circuits in accordance with an embodiment.

FIG. 5 is a block diagram of a semiconductor device 1000 in accordance with an embodiment.

The semiconductor device 1000 includes first and second data transmitting/receiving circuits 100 and 200 which transmit and receive data through channels 300.

Hereafter, a memory semiconductor device having a stacked structure will be taken as an example for description.

In this case, the first data transmitting/receiving circuit 100 may be included in a logic die 10C, and the second data transmitting/receiving circuit 200 may be included in a cell die 20C. The channels 300 may include a clock channel 321, a write data strobe (WDQS) channel 322, a read data strobe (RDQS) channel 323, data channels 330 and 331, and an address channel 360. Each of the channels may be implemented with a through-electrode 31C.

In the present embodiment, a reference clock signal RCLK is used to eliminate a skew.

The reference clock signal RCLK may be transmitted between the first and second data transmitting/receiving circuits 100 and 200 through the clock channel 321. Any one channel selected from channels which are not used for a skew elimination (hereinafter, de-skew) operation among the existing channels may be used as the clock channel 321.

In the following disclosure, zeroth and first data channels are provided, but a large number of data channels may be included. In the present embodiment, the zeroth data channel may represent even-numbered channels, and the first data channel may represent odd-numbered channels. Furthermore, grouping the channels by even and odd numbers is only an example of a schema for dividing the data channels. In another embodiment, the data channels may be divided according to a different schema.

In the present embodiment, the data channels are divided and used according to the division. As a result, an additional channel for a de-skew operation is not required.

The first data transmitting/receiving circuit 100 includes a de-skew control unit 110 for controlling a de-skew operation according to the RDQS signal and the data received through the data channels.

The first data transmitting/receiving circuit 100 includes a clock transmitting buffer 121, a WDQS Tx delay unit 122, an RDQS Rx delay unit 123, an even data Tx delay unit 130, an odd data Tx delay unit 131, an even data Rx delay unit 140, and an odd data Rx delay unit 141. The clock transmitting buffer 121 transmits the reference clock signal RCLK. The WDQS Tx delay unit 122 variably delays the WDQS signal, the RDQS Rx delay unit 123 variably delays the RDQS signal, the even data Tx delay unit 130 variably delays an even data signal to output, the odd data Tx delay unit 131 variably delays an odd data signal to output, the even data Rx delay unit 140 variably delays a received even data signal, and the odd data Rx delay unit 141 variably delays a received odd data signal.

The first data transmitting/receiving circuit 100 includes an even data Rx flip-flop 150 and an odd data Rx flip-flop 151. The even data Rx flip-flop 150 latches an output of the even data Rx delay unit 140 in synchronization with the received RDQS signal output by the RDQS Rx delay unit 123, and the odd data Rx flip-flop 151 latches an output of the odd data Rx delay unit 141 in synchronization with the received RDQS signal output by the RDQS Rx delay unit 123.

The first data transmitting/receiving circuit 100 includes a first switch 160, a second switch 161, and a third switch 162.

The first switch 160 provides the reference clock signal RCLK to the WDQS Tx delay unit 122 according to a switch control signal CSW, the second switch 161 provides the reference clock signal RCLK to the even data Tx delay unit 130 according to the switch control signal CSW, and the third switch 162 provides the reference clock signal RCLK to the odd data Tx delay unit 131 according to the switch control signal CSW. The switch control signal CSW, e.g., CSW[0:8], is generated by the de-skew control unit 110 for controlling a de-skew operation.

The second data transmitting/receiving circuit 200 includes a clock receiving buffer 221, a WDQS receiving buffer 222, an RDQS transmitting buffer 223, an even data transmitting buffer 230, an odd data transmitting buffer 231, an even data receiving buffer 240, and an odd data receiving buffer 241. The clock receiving buffer 221 receives the reference clock signal RCLK transmitted through the clock channel 321. The WDQS receiving buffer 222 receives the WDQS signal transmitted through the WDQS channel 322. The RDQS transmitting buffer 223 transmits the RDQS signal to the RDQS channel 323.

Figure 2:
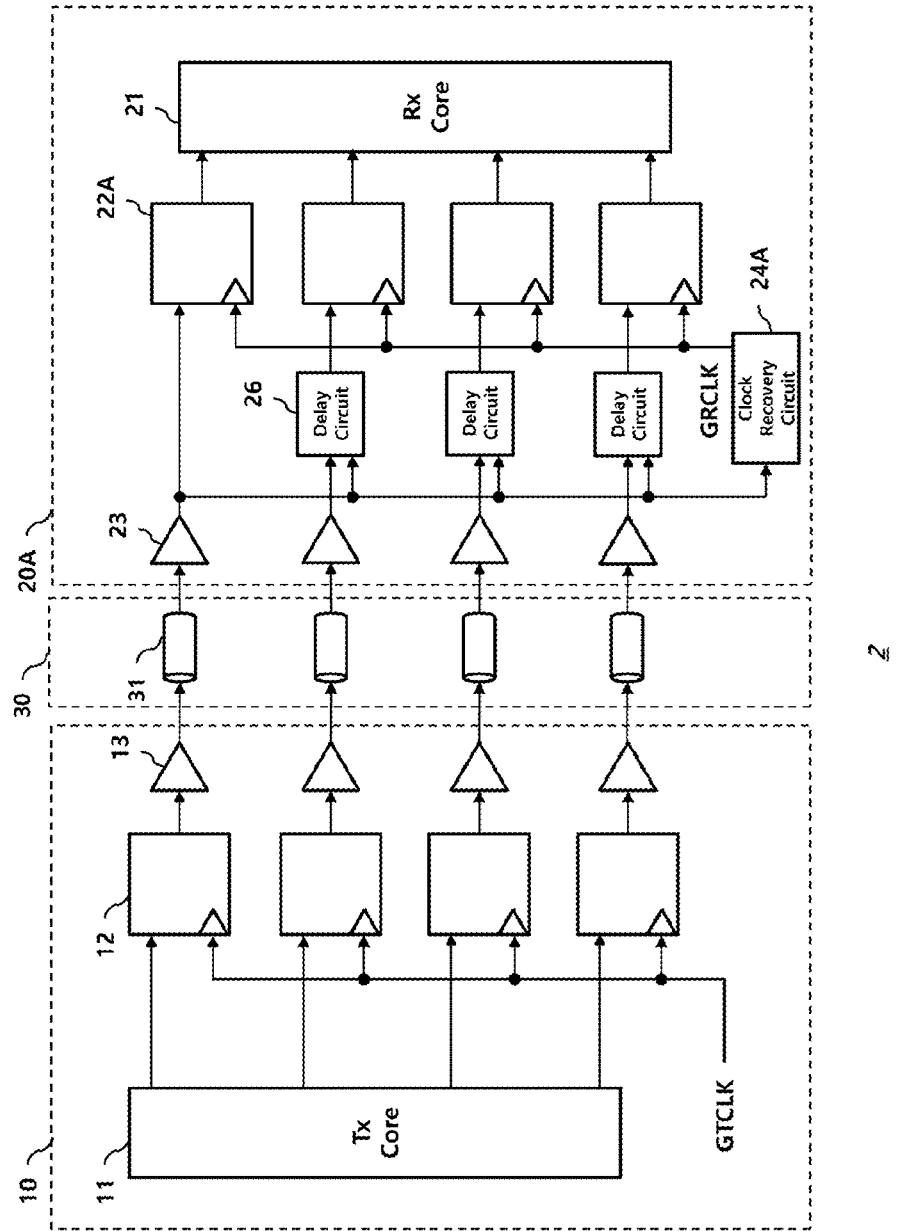
Figure 3:
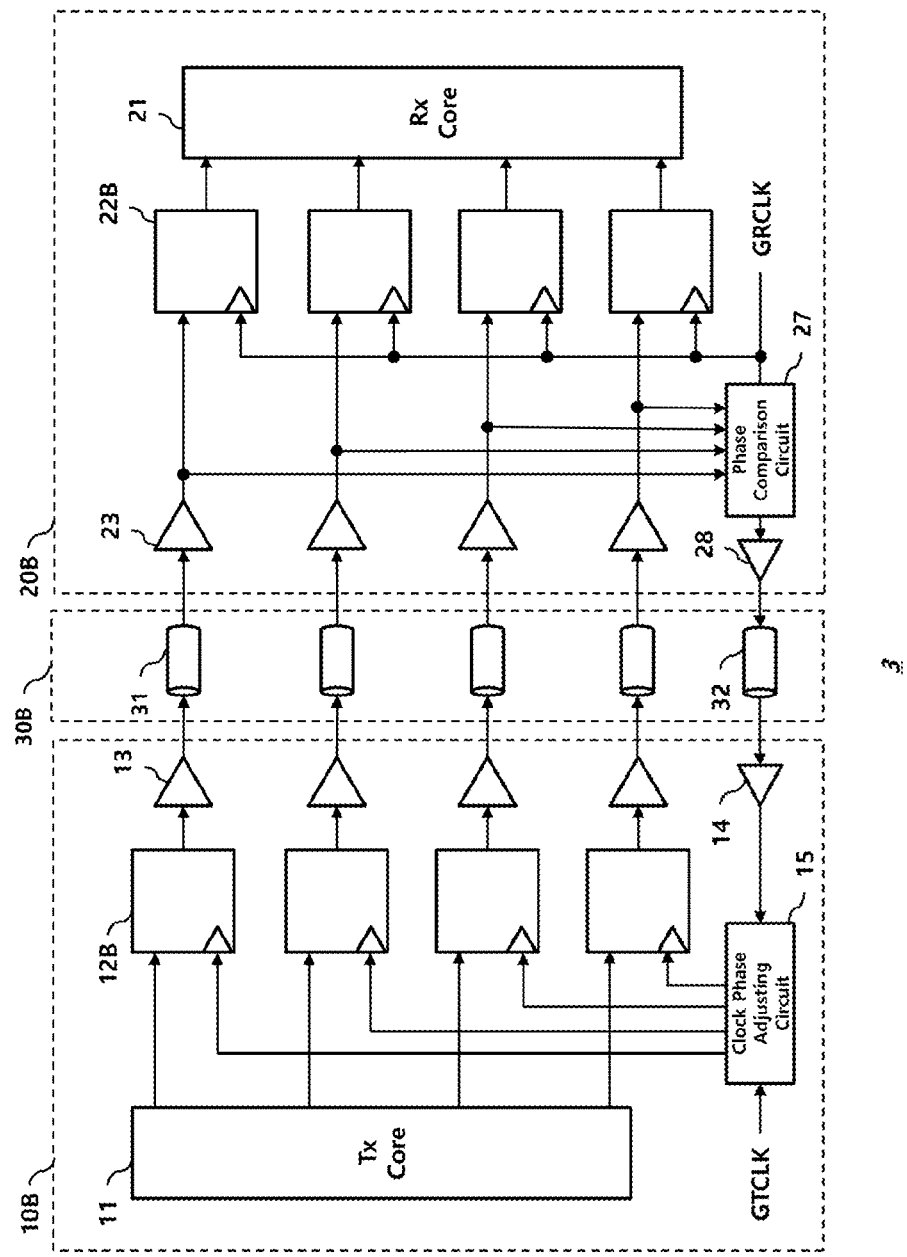

The second data transmitting/receiving circuit 200 does not include an additional circuit for performing a phase comparison operation for the de-skew operation as illustrated in FIGS. 1 to 3.

However, the second data transmitting/receiving circuit 200 may include a plurality of switches which are controlled by the switch control signal CSW, e.g., CSW[3:8], in order to control a path of the reference clock signal RCLK used during the de-skew operation.

The plurality of switches may include fourth to ninth switches 263 to 268. The fourth switch 263 provides the reference clock signal outputted from the clock receiving buffer 221 to the even data transmitting buffer 230. The fifth switch 264 provides the reference clock signal outputted from the clock receiving buffer 221 to the odd data transmitting buffer 231. The sixth switch 265 provides the reference clock signal outputted from the clock receiving buffer 221 to the RDQS transmitting buffer 223. The seventh switch 266 provides an output signal of the even data receiving buffer 240 as an input signal of the odd data transmitting buffer 231. The eighth switch 267 provides an output signal of the odd data receiving buffer 241 as an input signal of the even data transmitting buffer 230. The ninth switch 268 provides an output signal of the WDQS receiving buffer 222 as an input signal of the RDQS transmitting buffer 223.

As described above, the switch control signal CSW is provided from the de-skew control unit 110 during the de-skew operation. The switch control signal CSW may be provided through another channel existing between the first and second data transmitting/receiving circuits 100 and 200. In the present embodiment, the switch control signal CSW [3:8] is provided through the address channel 360 during the de-skew operation.

Hereafter, the de-skew operation of the first data transmitting/receiving circuit 100 will be described with reference to FIGS. 6 to 11.

The de-skew operation may be controlled by the de-skew control unit 110 of the first data transmitting/receiving circuit 100.

Figure 9:
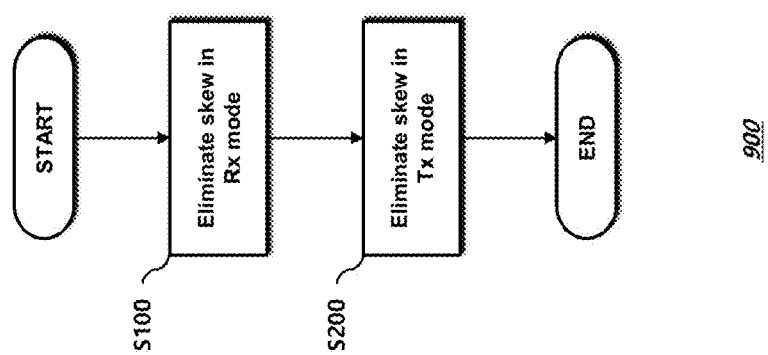
FIG. 9 is a flowchart illustrating a skew eliminating operation of the circuit of FIG. 5 in accordance with an embodiment.

FIG. 9 illustrates a de-skew operation 900 includes a step S100 of eliminating a skew in an Rx mode and a step S200 of eliminating a skew in a Tx mode, according to an embodiment.

The Rx mode may correspond to a logic die operation that reads data from a cell die, and the Tx mode may correspond to a logic die operation that writes data to a cell die.

Figure 6:
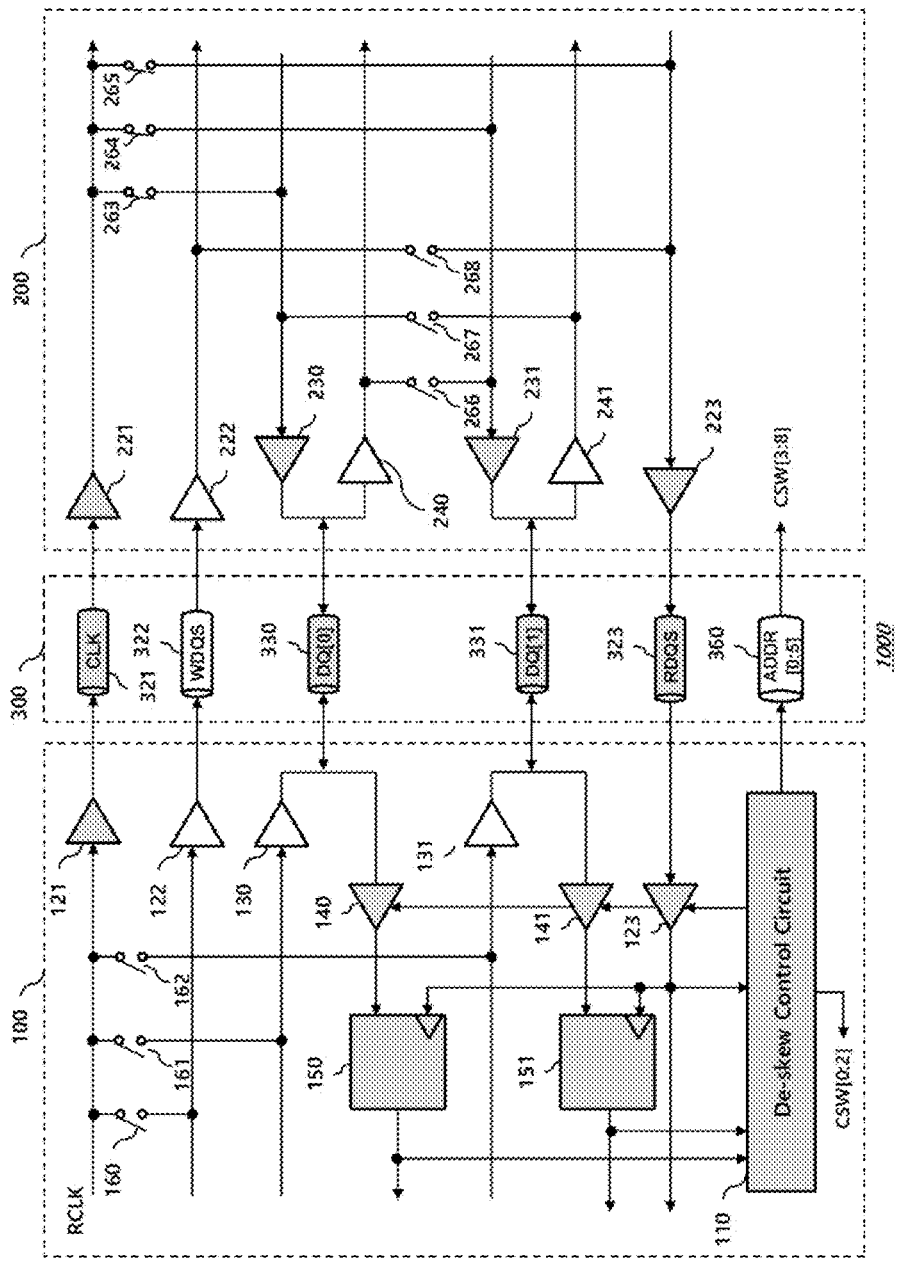
FIG. 6 is a block diagram illustrating a skew eliminating operation in an Rx mode of the semiconductor device of FIG. 5
Figure 10:
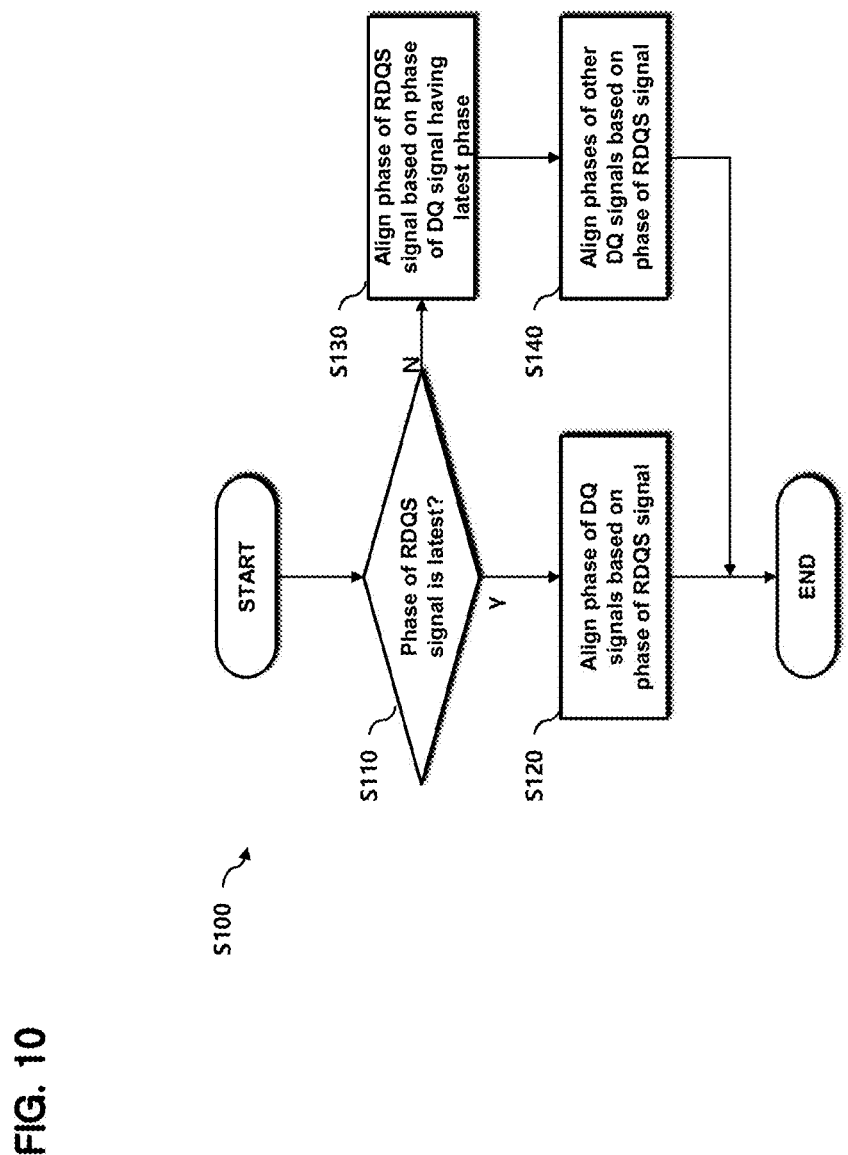
FIG. 10 is a flowchart illustrating a skew eliminating operation in the Rx mode of FIG. 9 in accordance with an embodiment.

FIG. 6 is a block diagram illustrating a configuration of the semiconductor device 1000 of FIG. 5 during the de-skew operation in the Rx mode. FIG. 10 is a flowchart illustrating details of the step S100 of eliminating the skew in the Rx mode.

During the de-skew operation for the Rx mode, the reference clock signal RCLK is provided to the second data transmitting/receiving circuit 200 through the clock transmitting buffer 121 and the clock channel 321.

In the second data transmitting/receiving circuit 200, the fourth to sixth switches 263 to 265 are turned on to provide the reference clock signal RCLK to the even data transmitting buffer 230, the odd data transmitting buffer 231, and the RDQS transmitting buffer 223.

As a result, the reference clock signal RCLK returns to the first data transmitting/receiving circuit 100 through the even data channel 330, the odd data channel 331, and the RDQS channel 323.

In the present embodiment, the reference clock signal RCLK is provided from the first data transmitting/receiving circuit 100 through the clock channel 321. However, in another embodiment, wherein the second data transmitting/receiving circuit 200 includes a reference clock generation circuit to generate the reference clock signal RCLK, the clock channel 321 may not be needed. Instead, the clock receiving buffer 221 may be coupled to the reference clock generation circuit instead of the clock channel 321.

The reference clock signal RCLK is received through the RDQS Rx delay unit 123, the even data Rx delay unit 140, and the odd data Rx delay unit 141.

The even data Rx flip-flop 150 latches an output signal of the even data Rx delay unit 140 in synchronization with an output signal of the RDQS Rx delay unit 123, and the odd data Rx flip-flop 151 latches an output signal of the odd data Rx delay unit 141 in synchronization with the output signal of the RDQS Rx delay unit 123.

The output signal of the RDQS Rx delay unit 123, an output signal of the even data Rx flip-flop 150, and an output signal of the odd data Rx flip-flop 151 are provided to the de-skew control unit 110.

The de-skew control unit 110 determines the sequential relationship among phases of the respective signals provided thereto, and controls the delay amounts of the RDQS Rx delay unit 123, the even data Rx delay unit 140, and the odd data Rx delay unit 141 according to the sequential relationship.

FIG. 10 discloses an embodiment of the step S100 of FIG. 9 having a sequence in which the de-skew control unit 110 controls the delay amounts of the RDQS Rx delay unit 123, the even data Rx delay unit 140, and the odd data Rx delay unit 141.

First, at step S110 the de-skew control unit 110 determines whether the phase of the RDQS signal outputted from the RDQS Rx delay unit 123 is the latest of the phases of the RDQS and data (DQ) signals.

When the phase of the RDQS signal is the latest, at step S120, the phases of DQ signals outputted from the even data Rx delay unit 140 and the odd data Rx delay unit 141 are aligned based on the phase of the RDQS signal.

The phase alignment may be achieved by adjusting the delay amounts of the even data Rx delay unit 140 and the odd data Rx delay unit 141.

When the phase of the RDQS signal is not the latest, at step S130, the phase of the RDQS signal is aligned based on the phase of the DQ signal which has the latest phase among the DQ signals. The phase alignment may be achieved by adjusting the delay amount of the RDQS Rx delay unit 123.

Then, at step S140, based on the phase of the RDQS signal, phases of the other DQ signals (that is, the DQ signals that do not have the latest phase) are aligned.

In the present embodiment, when the semiconductor device having a stacked structure has been taken as an example, the RDQS channel 323 exists in addition to the data channels. However, embodiments are not limited to the embodiment in which types of the channels are distinguished in the above-described manner. For example, in order to align phases of signals received from the same data channel, the same reference clock signals RCLK may be received from a plurality of data channels, and the phases of the received reference clock signals RCLK may be compared to adjust the delay amounts, which adjustments can alter a skew in the Rx mode.

Figure 7:
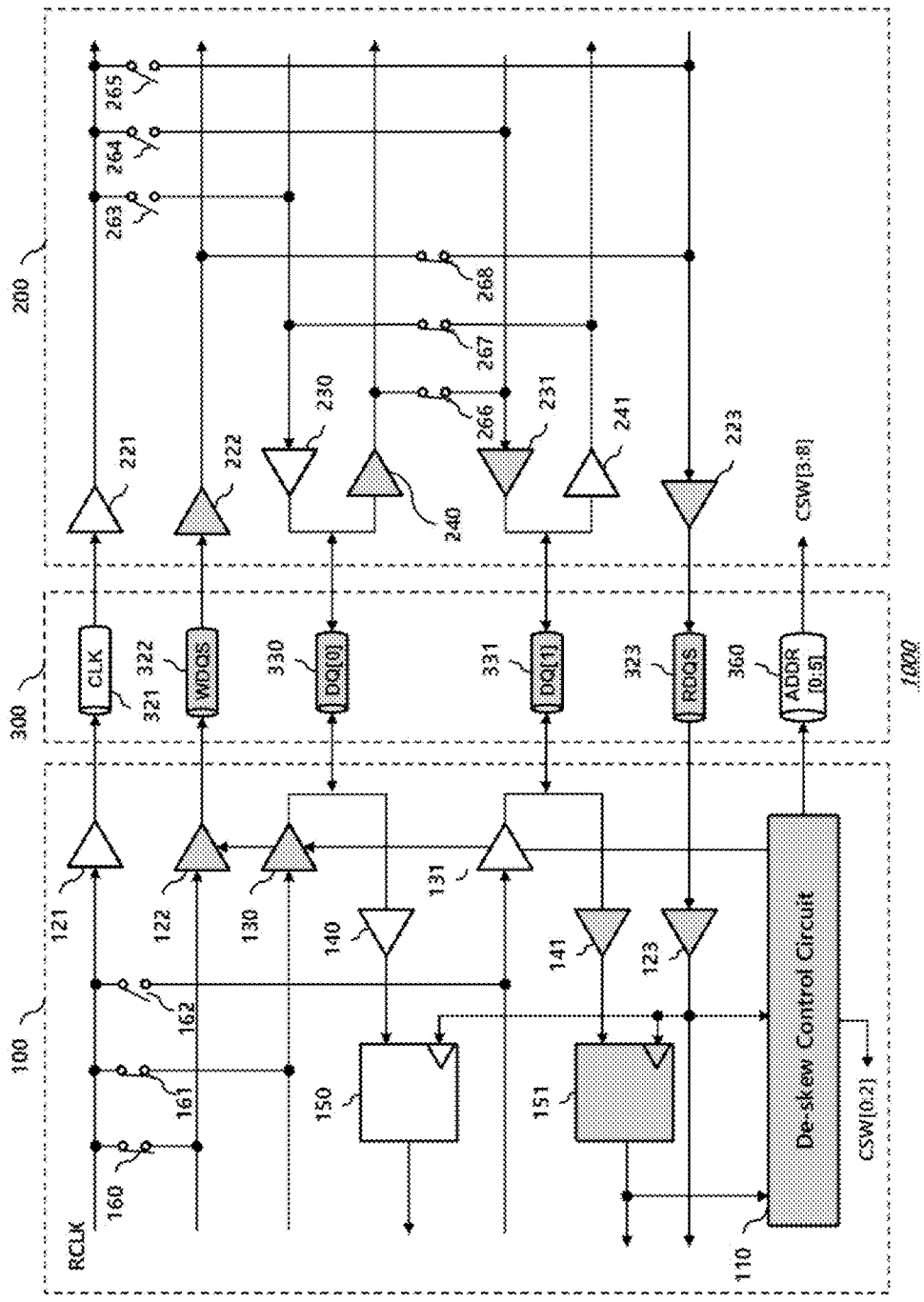
FIGS. 7 and 8 are block diagrams illustrating a skew eliminating operation in a Tx mode of the semiconductor device of FIG. 5.
Figure 8:
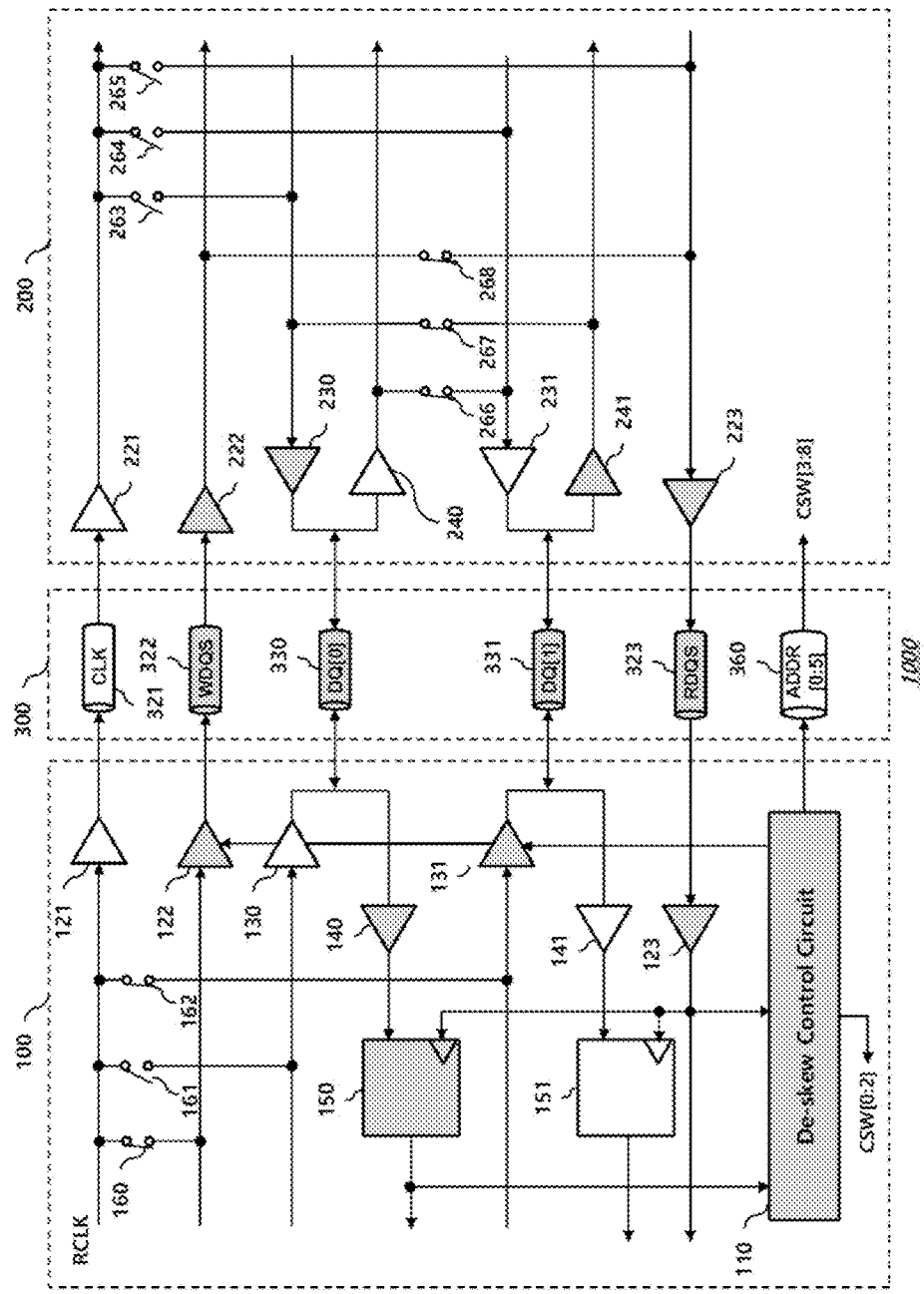

FIGS. 7 and 8 are block diagrams illustrating configurations of the semiconductor device 1000 during the de-skew operation in the Tx mode.

In the present embodiment, the de-skew operation in the Tx mode is performed through two steps after the data channels are divided into two groups. In the present embodiment, the data channels are divided into even channels and odd channels.

FIG. 7 illustrates the semiconductor device 1000 configured to acquire skew information of the even data channels or to adjust a skew, and FIG. 8 illustrates the semiconductor device 1000 configured to acquire skew information of the odd data channels or to adjust a skew.

First, FIG. 7 will be described.

The first and second switches 160 and 161 of the first data transmitting/receiving circuit 100 are turned on to provide the reference clock signal RCLK to the WDQS Tx delay unit 122 and the even data Tx delay unit 130.

The reference clock signal RCLK is provided to the second data transmitting/receiving circuit 200 through the WDQS channel 322 and the even data channel 330.

In the second data transmitting/receiving circuit 200, the seventh and ninth switches 266 and 268 are turned on. At this time, the eighth switch 267 may or may not be turned on.

The reference clock signal RCLK received by the WDQS receiving buffer 222 is outputted to the RDQS transmitting buffer 223 through the ninth switch 268, and the reference clock signal RCLK received by the even data receiving buffer 240 is outputted to the odd data transmitting buffer 231 through the seventh switch 266.

In the first data transmitting/receiving circuit 100, the reference clock signals RCLK transmitted through the RDQS channel 323 and the odd data channel 331 are received by the RDQS Rx delay unit 123 and the odd data Rx delay unit 141, respectively.

The odd data Rx flip-flop 151 latches an output signal of the odd data Rx delay unit 141 in synchronization with the WDQS signal outputted from the RDQS Rx delay unit 123.

The outputs of the RDQS Rx delay unit 123 and the odd data Rx flip-flop 151 may be provided to the de-skew control unit 110 to determine the sequential relationship of the phases.

FIG. 8 illustrates substantially the same operations as FIG. 7, except that the roles of the even and odd data channels are switched.

In FIG. 8, the second switch 161 is turned off and the third switch 162 is turned on to output the reference clock signal RCLK to the odd data channel 331 through the odd data transmitting buffer 131.

Furthermore, in the second data transmitting/receiving circuit 200, the signal outputted from the odd data receiving buffer 241 is provided to the even data transmitting buffer 230 and outputted to the even data channel 330. For this operation, the eighth and ninth switches 267 and 268 of the second data transmitting/receiving circuit 200 are turned on. However, the seventh switch 266 may or may not be turned on.

Furthermore, the output signal of the even data Rx flip-flop 150 is provided to the de-skew control unit 110.

Figure 11:
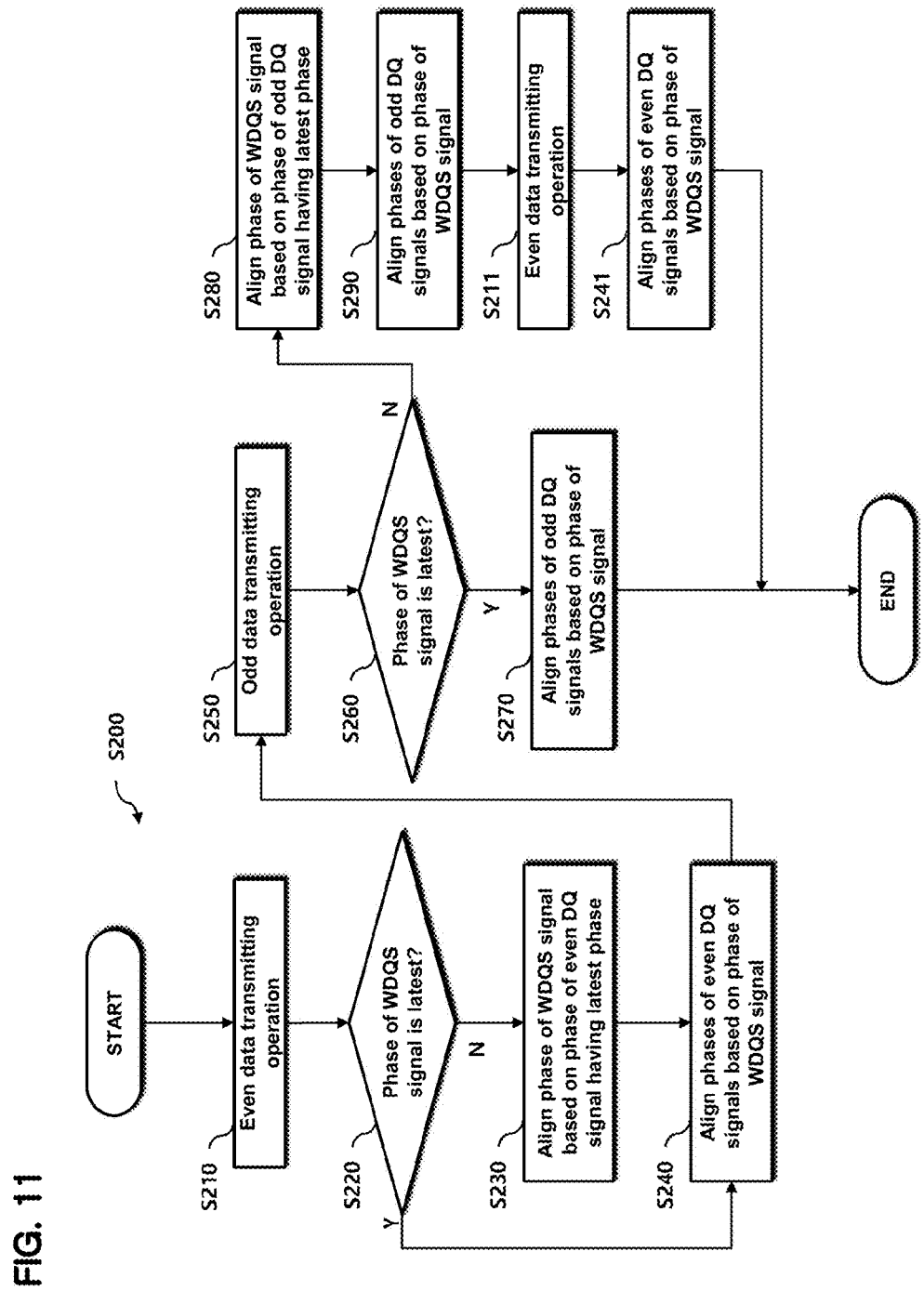
FIG. 11 is a flowchart illustrating a skew eliminating operation in the Tx mode of FIG. 9 in accordance with an embodiment.

FIG. 11 is a flowchart illustrating an embodiment of the skew adjusting operation in the Tx mode of step S200 of FIG. 9. In an embodiment, the delays of the RDQS Rx delay unit 123, the even data Rx delay unit 140, and the odd data Rx delay unit 141 have been adjusted according to the Rx de-skewing step S100 of FIG. 10 when the skew adjusting operation in the Tx mode is performed.

First, at step S210, an even data transmitting operation such as is illustrated by FIG. 7 is performed. At step S220, the phases of the even DQ signals and the WDQS signal received by the RDQS Rx delay unit 123 are compared to determine whether the phase of the WDQS signal is the latest.

When the phase of the WDQS signal is the latest, at step S240, the phases of the even DQ signals are aligned based on the phase of the WDQS signal, and at step S250 an odd data transmitting operation is performed.

When the phase of the WDQS signal is not the latest, at step S230, the phase of the WDQS signal is aligned based on the phase of the even DQ signal which has the latest phase among the phases of the even DQ signals. The phase of the WDQS signal may be aligned by adjusting a delay of the WDQS Tx delay unit 122.

Then, at step S240, the phases of the even DQ signals are aligned based on the phase of the WDQS signal. The phase of the even DQ signals may be aligned by adjusting a delay of the even data Tx delay unit 130. At step S250 the odd data transmitting operation is performed.

After the odd data transmitting operation is performed, at step S260, the phases of the odd DQ signals and the WDQS signal are compared to determine whether the phase of the WDQS signal is the latest.

When the phase of the WDQS signal is the latest, at step S270, the phases of the odd DQ signals are aligned based on the phase of the WDQS signal, and the procedure is ended. The phase of the odd DQ signals may be aligned by adjusting a delay of the odd data Tx delay unit 131.

When the phase of the WDQS signal is not the latest, at step S280, the phase of the WDQS signal is aligned based on the phase of the odd DQ signal which has the latest phase among the phases of the odd DQ signals.

Then, at step S290, based on the phase of the WDQS signal, the phases of the other odd DQ signals are aligned. At this time, since the phases of the even DQ signals are not aligned, at step S211 the even data transmitting operation is performed again. Then, based on the phase of the WDQS signal, at step S241 the phases of the even DQ signals are aligned, and the procedure is ended.

In the present embodiment, when the memory semiconductor device having a stacked structure has been taken as an example, the data channels, the WDQS channel, and the RDQS channel are distinguished from each other. However, embodiments are not limited thereto.

In another embodiment, the same data channels may be divided into two groups (for example, an even group and an odd group), a reference clock signal transmitted through one group of data channels may be received through the other group of data channels, and the reference clock signal transmitted through the other group of data channels may be received through the one group of data channels. Then, phase information may be obtained from differences in the phases of the signals received for each group and between the groups, and the phase information may be used to adjust the delay amount of the Tx delay units in order to adjust a skew in the Tx mode.

Figure 4:
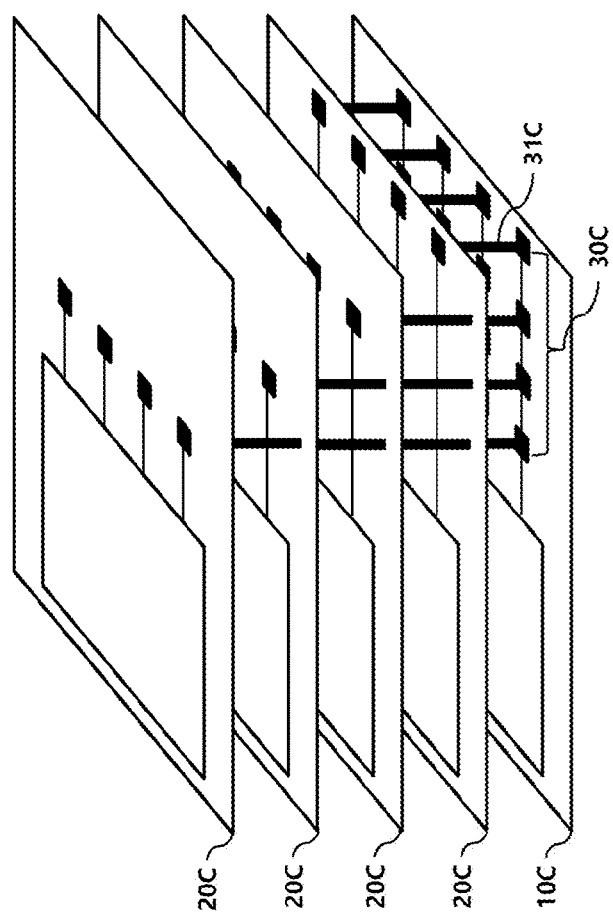
FIG. 4 is a block diagram of a memory semiconductor device having a stacked structure.

In accordance with the embodiments of the present disclosure, as one data transmitting/receiving circuit communicating with another data transmitting/receiving circuit eliminates all skews during Tx and Rx operations, the area of the circuit can be significantly reduced. When an embodiment is applied to a semiconductor memory device, such as, for example, the semiconductor device 4 of FIG. 4, the area of cells can be increased with respect to the area of the circuit required for eliminating a data skew.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a first data transmitting/receiving circuit;
   a second data transmitting/receiving circuit; and
   a plurality of channels configured to couple the first and second data transmitting/receiving circuits,
   wherein the first data transmitting/receiving circuit comprises:
      a Tx delay circuit configured to transmit data to the plurality of channels;
      an Rx delay circuit configured to receive data from the plurality of channels; and
      a de-skew control circuit configured to control delay amounts of the Tx delay circuit and the Rx delay circuit according to phase information of reference clock signals received through the plurality of channels, and
   wherein the second data transmitting/receiving circuit comprises a plurality of switches configured to commonly provide a given reference clock signal to the plurality of channels according to control of the de-skew control circuit, thereby transmitting the reference clock signals through the plurality of channels.

2. The semiconductor device of claim 1, wherein the de-skew control circuit is configured to adjust the delay amount of the Rx delay circuit and then adjust the delay amount of the Tx delay circuit.

3. The semiconductor device of claim 2, wherein the de-skew control circuit is configured to adjust the delay amount of the Rx delay circuit such that phases of the reference clock signals received from the second data transmitting/receiving circuit through the plurality of channels, excluding any one reference clock signal, are aligned based on a phase of the one reference clock signal.

4. The semiconductor device of claim 1, wherein the second data transmitting/receiving circuit further comprises a reference clock generation circuit configured to generate the given reference clock signal.

5. The semiconductor device of claim 1, wherein the first data transmitting/receiving circuit further comprises a reference clock generation circuit configured to generate the given reference clock signal, and wherein the second data transmitting/receiving circuit is configured to receive the given reference clock signal transmitted from the first data transmitting/receiving circuit through a clock channel among the plurality of channels.

6. The semiconductor device of claim 2, wherein the de-skew control circuit is configured to control the second data transmitting/receiving circuit such that the de-skew control circuit receives the reference clock signals from the second data transmitting/receiving circuit through a first group of channels among the plurality of channels when the first data transmitting/receiving circuit transmits the given reference clock signal through a second group of channels among the plurality of channels, and to control the second data transmitting/receiving circuit such that the de-skew control circuit receives the reference clock signals from the second data transmitting/receiving circuit through the second group of channels when the first data transmitting/receiving circuit transmits the given reference clock signal through the first group of channels.

7. The semiconductor device of claim 6, wherein the de-skew control circuit adjusts the delay amount of the Tx delay circuit such that a phase of any one signal between the reference clock signal received from the first group of channels and the reference clock signal received from the second group of channels is aligned according to a phase of the other signal.

8. The semiconductor device of claim 6, wherein the first data transmitting/receiving circuit comprises:
   a plurality of first switches configured to commonly provide the given reference clock signal to the first group of channels according to control of the de-skew control circuit; and
   a plurality of second switches configured to commonly provide the given reference clock signal to the second group of channels according to control of the de-skew control circuit, and
   wherein the second data transmitting/receiving circuit comprises a plurality of third switches configured to set a path for providing a signal received from the first group of channels to the second group of channels according to control of the de-skew control circuit, and providing a signal received from the second group of channels to the first group of channels according to control of the de-skew control circuit.

9. A semiconductor device comprising:
   a logic die;
   a plurality of cell dies vertically stacked over the logic die; and
   a plurality of through-electrodes configured to couple the logic die and the plurality of cell dies,
   wherein the logic die comprises:
      a TX delay circuit configured to transmit data to a data through-electrode among the plurality of through-electrodes;
      a write data strobe (WDQS) Tx delay circuit configured to transmit a WDQS signal to a WDQS through-electrode among the plurality of through-electrodes;
      an Rx delay circuit configured to receive data from the data through-electrode;
      a read data strobe (RDQS) Rx delay circuit configured to receive an RDQS signal from an RDQS through-electrode among the plurality of through-electrodes; and
      a de-skew control circuit configured to control delay amounts of the Tx delay circuit, the Rx delay circuit, the WDQS Tx delay circuit, and the RDQS Rx delay circuit according to phase information of reference clock signals received through the plurality of through-electrodes, and wherein a cell die among the plurality of cell dies comprises a plurality of switches configured to commonly provide a given reference clock signal to the plurality of data through-electrodes and the RDQS through-electrode according to control of the de-skew control circuit.

10. The semiconductor device of claim 9, wherein the de-skew control circuit is configured to adjust the delay amounts of the Rx delay circuit and the RDQS Rx delay circuit, and then adjust the delay amounts of the Tx delay circuit and the WDQS Tx delay circuit.

11. The semiconductor device of claim 10, wherein the de-skew control circuit is configured to adjust the delay amounts of the Rx delay circuit and the RDQS Rx delay circuit such that phases of the reference clock signals received through a plurality of data through-electrodes and the RDQS through-electrode, excluding any one reference clock signal, are aligned based on a phase of the one reference clock signal.

12. The semiconductor device of claim 10, wherein the de-skew control circuit is configured to control the cell die such that the de-skew control circuit receives the reference clock signals from the cell die through a first group of data through-electrodes among the plurality of data through-electrodes when a given reference clock signal is transmitted to the cell die through a second group of data through-electrodes among the plurality of data through-electrodes, to control the cell die such that the de-skew control circuit receives the reference clock signals from the cell die through the second group of data through-electrodes when the given reference clock signal is transmitted to the cell die through the first group of data through-electrodes, and to control the cell die such that the de-skew control circuit receives the reference clock signal from the cell die through the RDQS through-electrode when the given reference clock signal is transmitted to the cell die through the WDQS through-electrode.

13. The semiconductor device of claim 12, wherein the de-skew control circuit adjusts the delay amounts of the Tx delay circuit and the WDQS Tx delay circuit such that a phase of one signal of any two signals among the reference clock signals received from the first group of data through-electrodes, the reference clock signals received from the second group of data through-electrodes, and the reference clock signal received from the RDQS through-electrode is aligned according to a phase of the other signal.

14. The semiconductor device of claim 13, wherein the logic die comprises:
a plurality of first switches configured to commonly provide the given reference clock signal to the first group of data through-electrodes according to control of the de-skew control circuit;
a plurality of second switches configured to commonly provide the given reference clock signal to the second group of data through-electrodes according to control of the de-skew control circuit; and
a fourth switch configured to provide the given reference clock signal to the WDQS through-electrode, and
wherein the cell die comprises a plurality of third switches configured to set a path for providing a signal received from the first group of data through-electrodes to the second group of data through-electrodes according to control of the de-skew control circuit, providing a signal received from the second group of data through-electrodes to the first group of data through-electrodes according to control of the de-skew control circuit, and providing a signal received from the WDQS through-electrode to the RDQS through-electrode.

* * * * *